United States Patent [19]
Ueoka

[11] Patent Number: 5,081,514
[45] Date of Patent: Jan. 14, 1992

[54] PROTECTION CIRCUIT ASSOCIATED WITH INPUT TERMINAL OF SEMICONDUCTOR DEVICE

[75] Inventor: Junji Ueoka, Tokyo, Japan
[73] Assignee: Nec Corporation, Japan
[21] Appl. No.: 457,246
[22] Filed: Dec. 27, 1989
[30] Foreign Application Priority Data
  Dec. 27, 1988 [JP] Japan .................. 63-331725
[51] Int. Cl.[5] .............. H01L 29/06; H01L 29/78; H01L 29/90; H01L 29/02
[52] U.S. Cl. ................... 357/23.13; 357/13; 357/41; 357/51
[58] Field of Search .............. 357/52, 23.13, 13, 41

[56] References Cited

U.S. PATENT DOCUMENTS

| | | | |
|---|---|---|---|
| 3,325,706 | 6/1967 | Kruper | 357/36 |
| 3,525,909 | 8/1970 | Eberhard et al. | 357/36 |
| 4,189,739 | 2/1980 | Copeland | 357/23.13 |
| 4,305,085 | 12/1981 | Jaecklin et al. | 357/52 |
| 4,438,449 | 3/1984 | Usuda | 357/23.13 |
| 4,727,408 | 2/1988 | Hatakeyama | 357/52 |
| 4,821,089 | 4/1989 | Strauss | 357/52 |
| 4,862,229 | 8/1989 | Mundy et al. | 357/52 |
| 4,881,113 | 11/1989 | Momodomi et al. | 357/23.13 |
| 4,922,371 | 5/1990 | Grey et al. | 357/23.13 |

FOREIGN PATENT DOCUMENTS

| | | | |
|---|---|---|---|
| 56-007475 | 1/1981 | Japan | 357/52 |
| 56-094782 | 7/1981 | Japan | 357/52 |
| 57-095664 | 6/1982 | Japan | 357/52 |
| 59-224163 | 12/1984 | Japan | 357/23.13 |
| 60-257576 | 12/1985 | Japan | 357/23.13 |

*Primary Examiner*—Andrew J. James
*Assistant Examiner*—Daniel Kim
*Attorney, Agent, or Firm*—Ostrolenk, Faber, Gerb & Soffen

[57] ABSTRACT

A semiconductor device fabricated on an n-type substrate has a plurality of signal input terminals each associated with a protection circuit for preventing an internal integrated circuit from being damaged by an undesirable surge voltage. The protection circuit is formed in a p-type well and comprises an n-type impurity region supplied with the surge voltage, an inner well contact area located inside of the n-type impurity region and an outer well contact area located outside of the n-type impurity region, so that a large amount of current flows from both side surfaces of the n-type impurity region into the inner and outer well contact areas, thereby decreasing the voltage level in the p-type well for preventing the p-n junction between the well and the substrate from destruction.

8 Claims, 5 Drawing Sheets

PROTECTION CIRCUIT ASSOCIATED WITH INPUT TERMINAL OF SEMICONDUCTOR DEVICE

FIELD OF THE INVENTION

This invention relates to a semiconductor device and, more particularly, to a protection circuit associated with an input terminal of the semiconductor device.

DESCRIPTION OF THE RELATED ART

A plurality of terminals are incorporated in a semiconductor device for communication with external devices, and an input protection circuit is provided in association with each of the terminals, because an undesirable surge voltage may be applied to the terminal. A typical example of a protection circuit for CMOS implementation is shown in FIGS. 1 and 2, and is fabricated on an n-type semiconductor substrate 1. In the n-type semiconductor substrate 1 is formed a p-type well 2 where a well contact area 3 in turn is defined by a heavily doped p-type region. The well contact area 3 is located along the outer peripheral area of the p-type well 2. The central area of the p-type well 2 is provided with an n-type impurity region 4 which is isolated from the well contact area 3 by a thick oxide film 5. The semiconductor substrate 1 as well as the thick oxide film 5 are covered with an insulating film 6, and contact windows 7 and 8 are formed in the insulating film 6 so that the well contact area 3 and the n-type impurity region 4 are exposed. Wiring strips 9 and 10 are brought into contact with the well contact area 3 and the n-type region 4, respectively. Since the well contact window 7 is formed into a generally loop shape, the wiring strip 9 extends along the well contact area 3 along the periphery of the p-type well 2, and surrounds the wiring strip 10. The wiring strip 10 is coupled to an input terminal (not shown) as well as the gate electrode of an input gate transistor (not shown), and the wiring strip 9 is merged into a ground line 11.

When an undesirable surge voltage is applied to the input terminal and, accordingly, supplied to the wiring strip 10, the p-n junction between the n-type impurity region 4 and the p-type well 2 is causative of a breakdown phenomenon breaks down so that current flows from the n-type impurity region 4 through the p-type well 2 into the wiring strip 9. Thus, the excess voltage is discharged to the ground voltage line 11, and, for this reason, the input gate transistor is protected from the surge voltage.

However, a problem is encountered in the prior art protection circuit in that the p-n junction between the p-type well 2 and the n-type semiconductor substrate 1 tends to be broken due to the excess high voltage level in the p-type well upon the application of the surge voltage. In detail, the n-type impurity region 4 is formed in the center area of the p-type well, and the well contact area 3 surrounds the n-type impurity region 4. In this arrangement, the current flows partially from the bottom surface of the n-type impurity region 4 in a vertical direction as indicated by arrows V1 and partially from the outer side surface of the n-type impurity region 4 in a lateral direction indicated by arrows L1 and L2. The current flowing in the lateral direction reaches the p-type well contact area 3. However, the current flowing in the vertical direction increases the voltage level in the p-type well 2 and, accordingly, causes destruction of the p-n junction between the p-type well 2 and the n-type semiconductor substrate 1.

SUMMARY OF THE INVENTION

It is therefore an important object of the present invention to provide a protection circuit the arrangement of which is less likely to cause the destruction of the p-n junction between the well and the substrate.

To accomplish these objects, the present invention proposes to form well contact areas both inside and outside of a source of an excess current.

In accordance with the present invention, there is provided a protection circuit associated with a terminal for preventing an internal circuit integrated on a semiconductor substrate of a first conductivity type from an excess voltage, comprising: a) a well of a second conductivity type formed in the semiconductor substrate, the second conductivity type being opposite to the first conductivity type; b) a first impurity region of the first conductivity type formed in the well and shaped into a generally looped configuration so as to have an inner side surface, an outer side surface and a bottom surface, the terminal being coupled to the first impurity region; c) a second impurity region heavily doped with impurity atoms of the second conductivity type and having an outer side surface, the second impurity region being located inside of the first impurity region in such a manner that the outer side surface thereof faces the inner side surface of the first impurity region; d) a third impurity region heavily doped with impurity atoms of the second conductivity type and having an inner side surface, the third impurity region being located outside of the first impurity region in such a manner that the inner surface thereof faces the outer side surface of the first impurity region; and e) a current discharge line coupled to both of the second and third impurity regions.

BRIEF DESCRIPTION OF THE DRAWINGS

The features and advantages of a protection circuit according to the present invention will be more clearly understood from the following description taken in conjunction with the accompanying drawings in which.

DESCRIPTION OF THE PREFERRED EMBODIMENTS

First Embodiment

Figure 1:
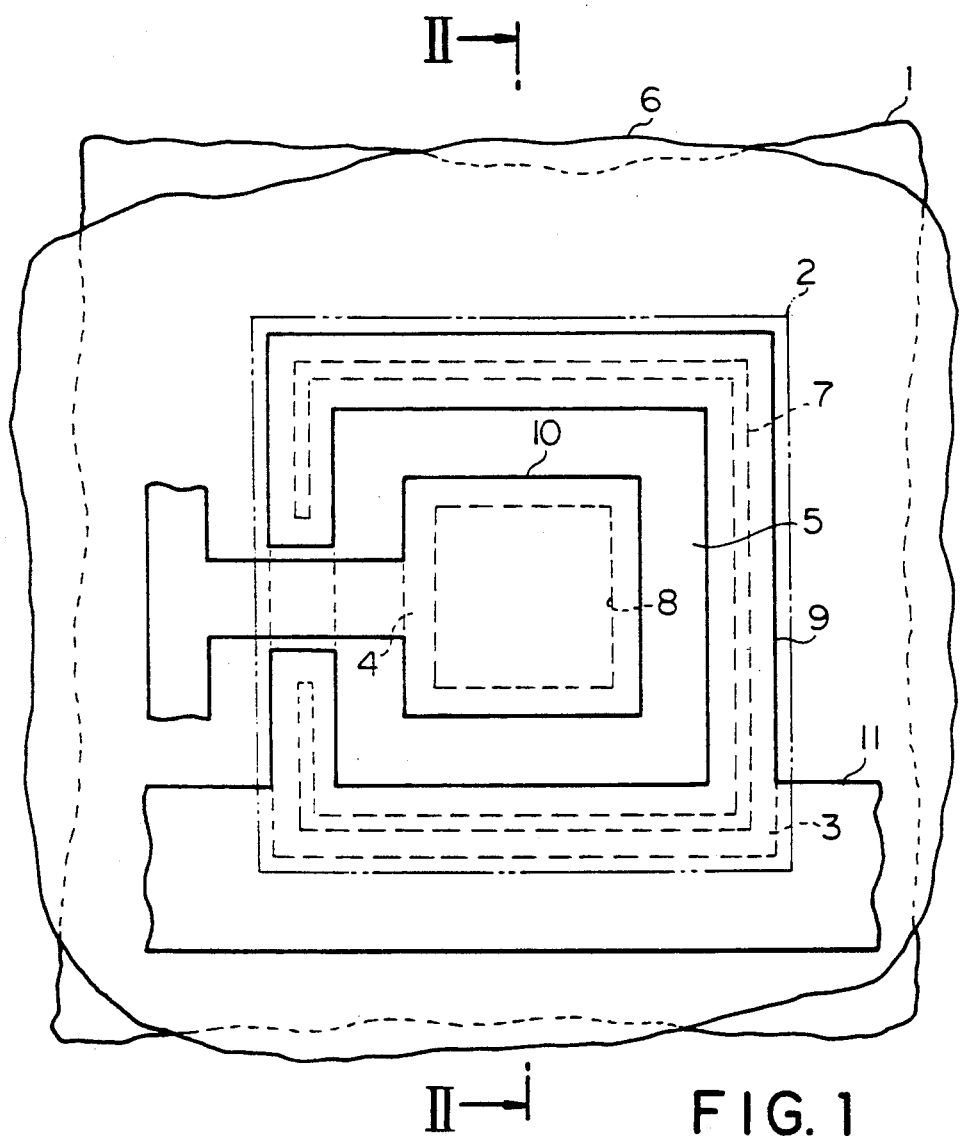
FIG. 1 is a plan view showing the layout of a prior art protection circuit.
Figure 2:
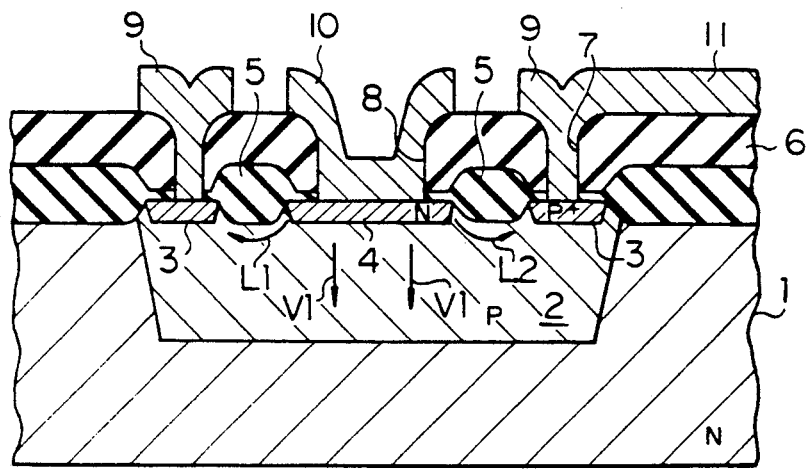
FIG. 2 is a cross sectional view taken along the line II—II of FIG. 1 and showing the structure of the prior art protection circuit.
Figure 3:
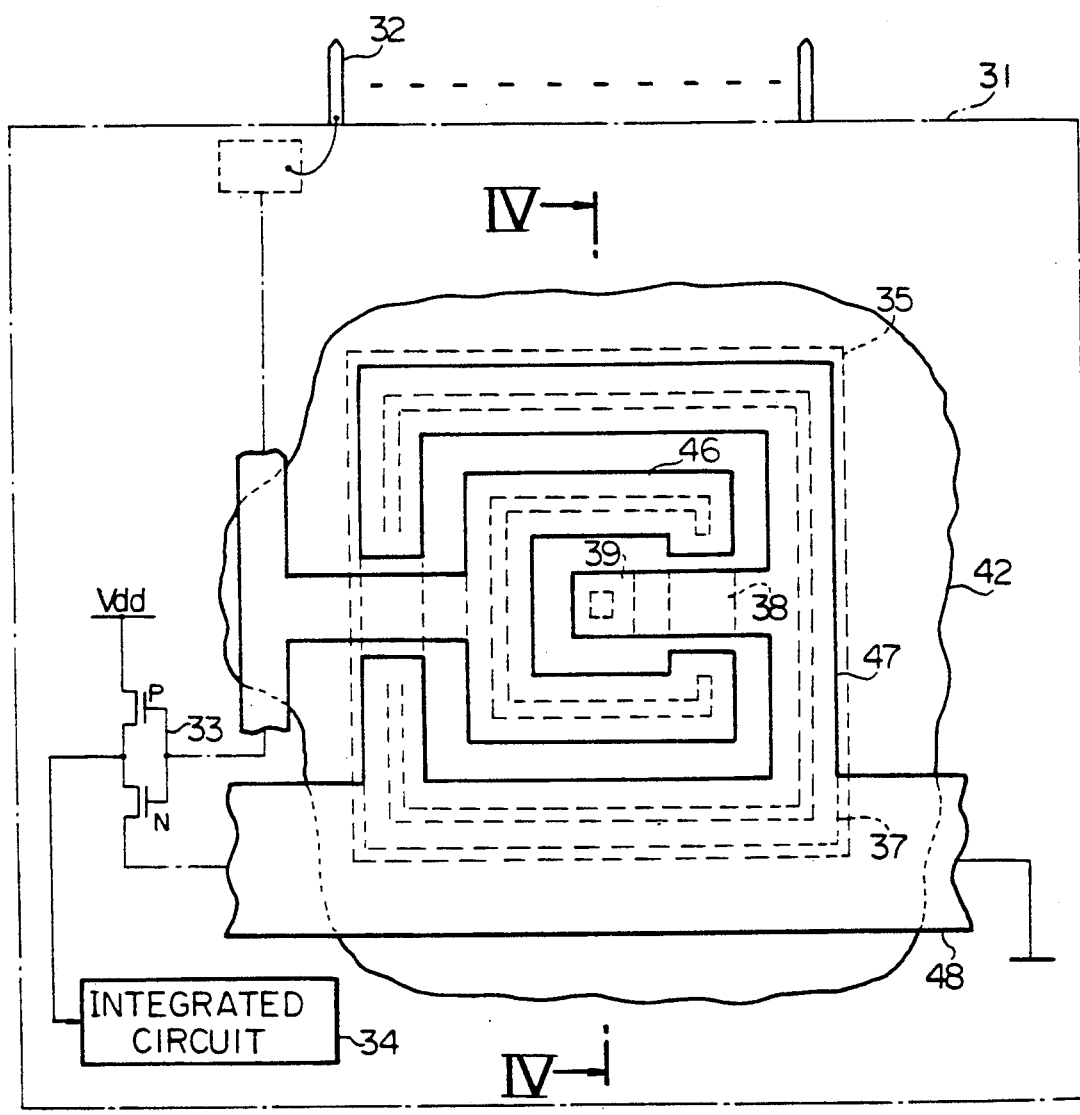
FIG. 3 is a plan view showing the layout of a protection circuit embodying the present invention.
Figure 4:
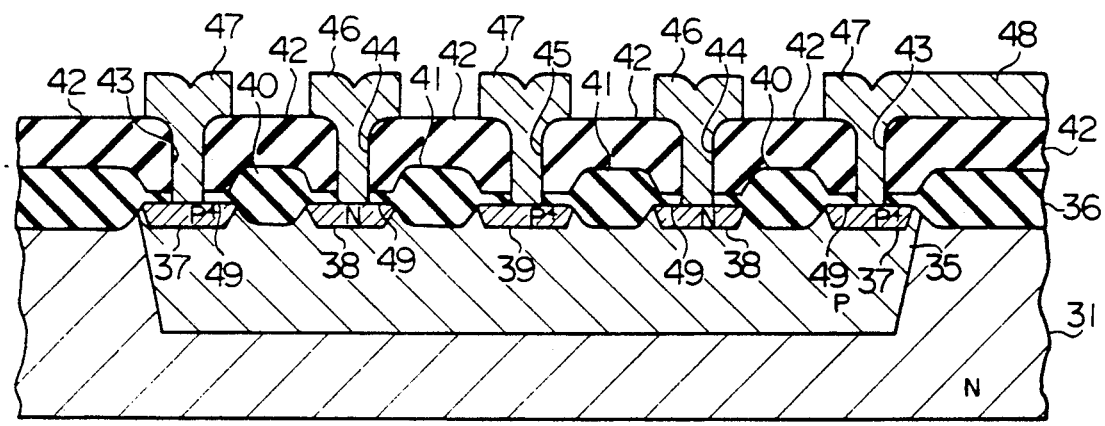
FIG. 4 is a cross sectional view taken along the line IV—IV of FIG. 3 and showing the structure of the protection circuit.

Referring first to FIGS. 3 and 4 of the drawings, a protection circuit embodying the present invention is fabricated on an n-type semiconductor substrate 31, and is provided in association with an input terminal 32 which is coupled to an input inverter circuit 33. The input inverter circuit 33 forms a part of an internal circuit together with an integrated circuit 34. Although a plurality of terminals are incorporated therein and associated with protection circuits, respectively, only one of the protection circuits is illustrated in FIG. 3.

In the semiconductor substrate 31 is formed a p-type well 35 which is surrounded by a thick oxide film 36. A heavily doped outer well contact region 37 is formed in an outer peripheral area of the p-type well 35, and is shaped into a looped configuration. The well contact region 37 has a generally rectangular outer periphery, which is defined by a rectangular outer side surface. The rectangular outer side surface is defined by two pairs of side surface portions, each pair of side surface portions being substantially parallel to each other. The well contact region 37 further has a generally rectangular inner periphery, which is defined by an inner side surface. The inner side surface has two pairs of side surface portions, and each pair of side surface portions is substantially parallel to each other.

An n-type impurity region 38 is further formed inside of the outer well contact region 37, and has a looped configuration. The n-type impurity region 38 has generally outer and inner rectangular peripheries. The outer periphery of the n-type impurity region 38 is constituted by an outer side surface having two pairs of side surface portions. The outer side surface of the n-type impurity region 38 is substantially in parallel to the inner side surface of the outer well contact region 37, and, for this reason, each pair of the side surface portions of the outer side surface of the impurity region 38 are substantially parallel to each other. The outer well contact region 37 is thus arranged in parallel to the n-type impurity region 38, and, accordingly, outer current can uniformly flow from the n-type region 38 to the outer well contact region 37 throughout the side surfaces.

Inside of the n-type impurity region 38 is further formed a heavily doped inner well contact region 39 which has a generally rectangular outer periphery. The inner well contact region 39 has an outer side surface which has two pairs of side surface portions. Each pair of the side surface portions are substantially in parallel to each other. The outer periphery of the inner well region 39 faces the inner side surface of the n-type impurity region 38 substantially in parallel to each other, so that inner current can uniformly flow from the n-type impurity region 38 to the inner well contact region 39 throughout the side surface portions.

As will be better seen from FIG. 4, oxide films 40 and 41 are provided between the outer well contact region 37, the n-type impurity region 38 and the inner well contact region 39 for providing electrical isolation under usual operating conditions. The oxide films 40 and 41 are covered with an insulating film 42, and contact holes 43, 44 and 45 are formed in the insulating film 42 and an insulating film 49 provided thereunder, and respectively expose the outer well contact region 37, the n-type impurity region 38 and the inner well contact region 39. The terminal is electrically connected to the n-type impurity region 38 through a wiring strip 46, and another wiring strip 47 is patterned to provide an interconnection between a ground line 48 and the outer and inner well contact regions 37 and 39. In this embodiment, the n-type impurity region 38, the inner well contact region 39 and the outer well contact region 37 provide first, second and third impurity regions, respectively.

In the usual operations, a signal supplied to the terminal 32 has a voltage level which varies within a normal voltage range, and the signal is relayed to the input inverter circuit 32, but no breakdown takes place at the p-n junction between the n-type impurity region 38 and the p-type well 35. However, if an undesirable surge voltage or an excess voltage is supplied to the terminal 32, outer and inner currents flow respectively toward the outer region 37 and the inner region 39 over the p-n junction between the n-type impurity region 38 and the p-type well 35. Since the breakdown takes place uniformly throughout the p-n junctions between the region 38 and the well 35, due to the constant distances between the region 38, and the regions 37 and 39, the outer and inner currents easily decrease the surge voltage, and, accordingly, protect the input inverter circuit 33 from undesirable damage.

Second Embodiment

Figure 5:
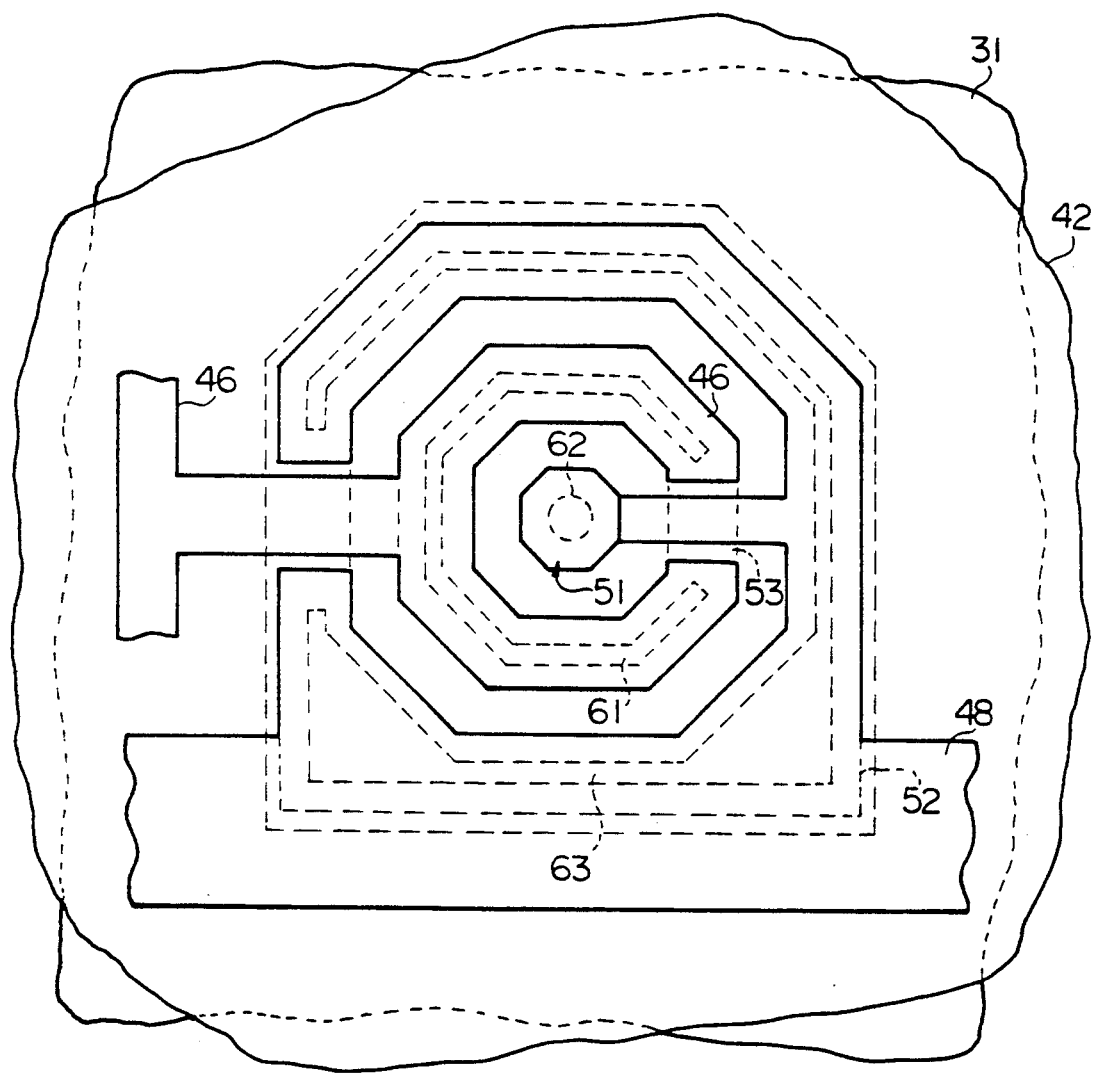
FIG. 5 is a plan view showing the layout of another protection circuit embodying the present invention.

Turning to FIG. 5 of the drawings, another protection circuit is illustrated. The protection circuit shown in FIG. 5 is similar in construction to the protection circuit shown in FIG. 3 with the exception of the configurations of heavily doped p-type inner and outer well contact regions 51 and 52 as well as the configuration of n-type impurity region 53. For this reason, the corresponding regions and films are designated by the same reference numerals used in FIG. 3 without any detailed description.

The inner well contact region 51 has a generally polygonal or, more particularly, octagonal outer periphery, and the inner periphery of the n-type impurity region 53 is constituted by an inner side surface substantially parallel to the outer side surface of the inner well contact region 51. The n-type impurity region 53 further has an outer side surface which is also substantially parallel to the inner side surface of the outer well contact region 52. The outer side surface of the n-type impurity region 53 forms a generally polygonal or octagonal periphery, and, accordingly, the inner side surface of the outer well region 52 forms a generally polygonal or octagonal periphery. A contact window 61 allows the wiring strip 46 to be brought into contact with the n-type impurity region 51, and contact windows 62 and 63 also permit the wiring strip 48 to come into contact with the inner and outer well contact regions 51 and 52, respectively. Since the generally octagonal portion of the wiring strip 48 as well as the generally octagonal portion of the wiring strip 46 are respectively overlapped with the outer well contact region 52 and the n-type impurity region 53, broken lines indicating the boundaries of those regions are merely shown at the gaps of the wiring strips.

In the protection circuit thus shaped, wherein the corners of the regions form substantially 135° angles, the inner and outer currents, from the region 53, to the regions 51 and 52 respectively, are hardly concentrated at the corners of the regions.

This results in that the uniformity of each current is further enhanced.

Although particular embodiments of the present invention have been shown and described, it will be obvious to those skilled in the art that the claimed invention also includes various changes and modifications which may be made without departing from the spirit and scope of the present invention.

What is claimed is:

1. A protection circuit associated with a terminal for protecting an internal circuit integrated on a semiconductor substrate of a first conductivity type from being damaged by an excess terminal voltage, said semiconductor substrate being covered with an insulating film, said terminal extending across said insulating film, comprising:

a) a well of a second conductivity type formed in said semiconductor substrate, said second conductivity type being opposite to said first conductivity type;

b) a first impurity region of said first conductivity type formed in said well and located between inner and outer regions of said well, said inner region being located inside of said first impurity region, said outer region being located outside of said first impurity region, said terminal having a trunk portion and first and second branch portions extending from said trunk portion and located over said first impurity region, said first and second branch portions having respective distal ends spaced apart from each other by a distance, said branch portions of said terminal being in contact with said first impurity region through a first contact window formed in said insulating film;

c) a second impurity region heavily doped with impurity atoms of said second conductivity type and formed in said inner region of said well;

d) a third impurity region heavily doped with impurity atoms of said second conductivity type and formed in said outer region of said well; and e) a current discharge line extending across said insulating film having a trunk portion in contact with said third impurity region through a second contact window formed in said insulating film, and third and fourth branch portions being in contact with said third impurity region through said second contact window and extending so that said third and fourth branch portions substantially surround said terminal, said third and fourth branch portions having respective distal ends facing both sides of said trunk portion, respectively, said current discharge line further having a fifth branch portion extending through said terminal gap and being in contact with said second impurity region through a third contact window formed in said insulating film, a p-n junction being formed between said first impurity region and said well, said p-n junction being broken down upon application of said excess terminal voltage so that current flows from said terminal through said first impurity region, said p-n junction, said well and said second and third impurity regions to said current discharge line.

2. A protection circuit as set forth in claim 1, in which said second impurity region has a generally rectangular outer periphery.

3. A protection circuit as set forth in claim 2, in which said first impurity region has generally rectangular outer and inner peripheries.

4. A protection circuit as set forth in claim 3, in which said third impurity region has generally rectangular inner periphery.

5. A protection circuit as set forth in claim 1, in which said second impurity region has a generally polygonal outer periphery.

6. A protection circuit as set forth in claim 5, in which said first impurity region has generally polygonal outer and inner peripheries.

7. A protection circuit as set forth in claim 6, in which said third impurity region has a generally polygonal inner periphery.

8. A protection circuit as set forth in claim 7, in which said generally polygonal peripheries are octagonal.

* * * * *